(12) United States Patent
Park et al.

(10) Patent No.: US 7,518,410 B2
(45) Date of Patent: Apr. 14, 2009

(54) DUPLEXER

(75) Inventors: Yun-kwon Park, Yongin-si (KR); Sang-chul Sul, Yongin-si (KR); In-sang Song, Yongin-si (KR); Chul-soo Kim, Yongin-si (KR); Seok-chul Yun, Yongin-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 11/648,664

(22) Filed: Jan. 3, 2007

(65) Prior Publication Data

US 2007/0182509 A1    Aug. 9, 2007

(30) Foreign Application Priority Data

Feb. 6, 2006   (KR) .................. 10-2006-0011164

(51) Int. Cl.
*H01L 41/00* (2006.01)
*H03H 9/00* (2006.01)

(52) U.S. Cl. .................. 326/133; 333/189; 333/193

(58) Field of Classification Search .................. 333/189, 333/193, 133
See application file for complete search history.

(56) References Cited

U.S. PATENT DOCUMENTS

| 6,885,260 B2* | 4/2005 | Nishimura et al. | 333/133 |
| 6,909,338 B2* | 6/2005 | Omote | 333/133 |
| 2005/0110596 A1* | 5/2005 | Yamakawa et al. | 333/189 |

* cited by examiner

*Primary Examiner*—Anh Q Tran
(74) *Attorney, Agent, or Firm*—Sughrue Mion, PLLC

(57) ABSTRACT

A duplexer is provided. The duplexer includes a first band pass filter (BPF) coupled to a first signal port and a second signal port; and a second BPF coupled to the first signal port and a third signal port, each of the first BPF and the second BPF including a first resonance circuit which comprises a plurality of first resonators coupled in series; a second resonance circuit which comprises a plurality of second resonators coupled in series; and a third resonance circuit which comprises a plurality of third resonators coupled in parallel and formed in divided lines coupling the first and second resonance circuits.

17 Claims, 11 Drawing Sheets

| m1 | m2 |
|---|---|
| freq=2.072GHz | freq=2.134GHz |
| dB=-1.911 | dB=-1.501 |
| m3 | m4 |
| freq=1.939GHz | freq=1.882GHz |
| dB=-52.781 | dB=-54.001 |

DUPLEXER

CROSS-REFERENCE TO RELATED APPLICATIONS

This application claims priority from Korean Patent Application No. 10-2006-0011164, filed Feb. 6, 2006, in the Korean Intellectual Property Office, the entire contents of which are incorporated herein by reference.

BACKGROUND OF THE INVENTION

1. Field of the Invention

Apparatuses consistent with the present invention generally relate to a duplexer, and more particularly, to a duplexer capable of preventing interference between a transmit (Tx) filter and a receive (Rx) filter by virtue of structures of the Tx filter and the Rx filter.

2. Description of the Related Art

Recently, as mobile communication devices, such as mobile phones, are widely used, there are ongoing efforts to improve performance of the mobile communication devices and to manufacture them in small size with light weight. Accordingly, research is in progress to reduce the size and weight of mobile communication devices, while simultaneously enhancing the performance of components in the mobile communication device.

To this end, research is being conducted on performance enhancement of a duplexer which is one of the components of a mobile communication device.

A duplexer is a kind of representative element that incorporates filters. The duplexer functions to permit the efficient sharing of the same antenna in a communication system which is implemented using frequency division duplex (FDD) by properly separating signals received and transmitted via the antenna.

The duplexer largely includes a Tx filter and a Rx filter. The Rx filter receives a signal from an antenna and filters only a signal of a certain frequency band. The Tx filter filters only a signal of a certain frequency band of a signal produced in a communication device and provides the filtered signal to the antenna. Accordingly, the duplexer permits the transmission and the reception via one antenna by adjusting the frequencies passed by the Tx filter and the Rx filter.

The Tx filter and the Rx filter of the duplexer can be implemented using a film bulk acoustic resonator (FBAR).

The FBAR is manufactured such that a lower electrode, a piezoelectric layer, and an upper electrode are layered in order. When an external electric field is applied, the FBAR generates resonance. In more detail, when the electrical energy is applied to the upper and lower electrodes of the FBAR and an electric field temporally changing is induced in the piezoelectric layer, resonance occurs since the piezoelectric layer causes the piezoelectric effect which changes the electric energy into mechanical energy of an acoustic waveform. In this case, since the FBAR passes only a signal within a specific band centering on the generated resonant frequency, it serves as a band pass filter.

The FBAR can be implemented in a small size and with light weight, and is suitable for high-power applications. In addition, the FBAR is advantageous in view of compactness, manufacturing cost, and mass production.

When the filter is constructed using FBARs as mentioned above, it is possible to raise the quality factor (Q), which is one of principal properties of the filter, and to cover a wide driving frequency, e.g., from frequency bands of micro unit to personal communication system (PCS) and digital cordless system (DCS) frequency bands. Based on these features, the FBAR is attracting much attention as a component for use in a duplexer.

FIG. 11 is a block diagram of a related art duplexer using a plurality of FBARs, as disclosed in U.S. Pat. No. 6,262,637. FIG. 12 is a diagram illustrating a function of the phase shifter 70 of FIG. 11, and FIG. 13 is another diagram illustrating the function of the phase shifter 70 of FIG. 11.

Referring first to FIG. 11, the related art duplexer 10 includes an antenna port 20, a Tx port 30, and a Rx port 40. The duplexer 10 further includes a Tx filter 50 between the antenna port 20 and the Tx port 30, and a Rx filter 60 between the antenna port 20 and the Rx port 40.

The Tx filter 50 includes a plurality of first resonators FBAR11, FBAR12, and FBAR13 that are connected in series between the antenna port 20 and the Tx port 30, and a plurality of second resonators FBAR21 through FBAR22 that are formed on divided lines between the antenna port 20 and the Tx port 30 to which the Tx filter 50 is connected while coupled to the first resonators FBAR11 though FBAR13 in parallel.

Similarly, the Rx filter 60 includes a plurality of first resonators FBAR14, FBAR15, and FBAR16 that are connected in series between the phase shifter 70 and the Rx port 40, and a plurality of second resonators FBAR23 through FBAR26 that are formed on divided lines between the phase shifter 70 and the Rx port 40 to which the Rx filter 40 is connected while coupled to the first resonators FBAR14 though FBAR16 in parallel As such, the first resonators FBAR11 through FBAR13 and the second resonators FBAR21 through FBAR22 are incorporated in series and in parallel so as to constitute a ladder type filter forming the Tx filter 50. Similarly, the first resonators FBAR14 through FBAR16 and the second resonators FBAR23 through FBAR26 are incorporated in series and in parallel so as to constitute a ladder type filter forming the Rx filter 40. Accordingly, the related art duplexer 10 functions as a band pass filter which filters signals in specific frequency bands. for the transmission and the reception.

Since the related art duplexer 10 functions to properly separate the signals transmitted and received via one antenna, it is necessary to avoid interference between the transmitted signal and the received signal in order to improve its performance. In further detail, since the frequency difference between the signals transmitted and received through the Tx filter and the Rx filter is very small, the duplexer is prone to, and sensitively responds to, interference. Therefore, it is required to avoid the interference between the transmitted signal and the received signal.

For doing so, an isolation part is required to prevent the interference by isolating the Tx filter 50 and the Rx filter 60. Thanks to the presence of the isolation part, the performance of the related art duplexer 10 can be enhanced because the interference and the noise insertion are avoided.

The isolation part is typically implemented as a phase shifter 70, which is interposed between the antenna port 20 and the Rx filter 60, using a capacitor and an inductor to make the frequency phase difference of the transmitted and received signals 90 degrees. Consequently, the isolation part can block the interference.

When the phase shifter 70 is not used and the Rx frequency band ranges 1.88~1.95 GHz by way of example as shown in FIG. 12, impedance of the Rx filter 60 to the Tx filter 50 is close to zero. Accordingly, the Tx filter 50 and the Rx filter 60 are electrically connected and the Tx filter 50 is coupled and operated by the received signal.

By contrast, when the phase shifter 70 is interposed between the antenna port 20 and the Rx filter 60 and the Rx frequency band ranges 1.88~1.95 GHz by way of example as shown in FIG. 13, impedance of the Rx filter 60 to the Tx filter 50 is close to infinity. Accordingly, the Tx filter 50 and the Rx filter 60 are in a line-open state and electrically isolated from each other, and the Tx filter 50 is prevented from being coupled and operated by the received signal.

As such, the Tx filter 50 and Rx filter 60 serve as the duplexer which shares a single antenna by filtering only Tx signal and Rx signal of the filtered frequency band by means of the phase shifter 70.

As discussed above, the isolation part of the related art duplexer 10 is constructed by incorporating the capacitors and the inductors between the antenna port 20 and the Rx filter 40. Thus, when the related art duplexer is implemented as a single chip set, there is a disadvantage in that a process margin is deteriorated because the number of processes increases for the implementation of capacitors and inductors on the substrate in addition to the fabrication of the FBARs. Moreover, another disadvantage is that an assembly cost of the duplexer rises because of the increased number of processes and the implementation cost of the circuit elements.

SUMMARY OF THE INVENTION

Exemplary embodiments of the present invention may overcome the above disadvantages and other disadvantages not described above. However, the present invention is not required to overcome the disadvantages described above, and an exemplary embodiment of the present invention may not overcome any of the problems described above. The present invention provides a duplexer capable of preventing possible interference between a Tx filter and a Rx filter without an additional component such as phase shifter.

According to an aspect of the present invention, there is provided a duplexer which includes a first band pass filter (BPF) and a second BPF. The first BPF is interposed between a first signal port and a second signal port. The second BPF is interposed between the first signal port and a third signal port.

Each of the first BPF and the second BPF includes a first resonance circuit, a second resonance circuit, and a third resonance circuit. The first resonance circuit includes one or more first resonators connected in series. The second resonance circuit faces the first resonance circuit and includes one or more second resonators connected in series. The third resonance circuit includes one or more third resonators connected in parallel and formed in divided lines connecting the first and second resonance circuits.

The first, second, and third resonators may be film bulk acoustic resonators (FBARs).

The first and second BPFs may filter signals of first and second frequency bands, respectively, the second BPF may be in a line-open state in the first frequency band, and the first BPF may be in a line-open state in the second frequency band.

The first resonance circuit of the first BPF may be between the first signal port and the second signal port, and the first resonance circuit of the second BPF may be between the first signal port and the third signal port.

Both ends of the second resonance circuit of each of the first and second BPFs may be connected to ground.

In the second resonance circuit of the first BPF, an arbitrary node of nodes between the second resonators may be connected to the ground. In the second resonance circuit of the first BPF, only one of the nodes between the second resonators may be connected to the ground.

The first BPF may further include inductors between the second resonance circuit and the ground.

The first BPF may further include inductors connected to a front-end first resonator and a back-end first resonator, respectively, of the first resonators of the first resonance circuit in parallel.

The first and second resonators of the first BPF may be arranged to face each other, and the divided lines may interconnect the facing first and second resonators.

The first and second resonators of the second BPF may be arranged to face each other, a first divided line of at least one pair of the divided lines may link a front-end node of the first resonator with a back-end node of the second resonator, and a second divided line may link a back-end node of the first resonator with a front-end node of the second resonator.

The second BPF may further include fourth resonators between the first signal port and the first resonance circuit and between the second signal port and the first resonance circuit, respectively, to improve impedance matching and attenuation characteristic. The second BPF may further include an inductor which is connected to the fourth resonator between the first signal port and the first resonance circuit in parallel.

The second BPF may further include an inductor between the back end of the second resonance circuit and the ground.

With the duplexer constructed above, the Rx filter is in a line-open state with respect to the frequency band filtered and output from the Tx filter. Therefore, interference between the Tx filter and the Rx filter can be prevented without an additional component such as phase shifter.

BRIEF DESCRIPTION OF THE DRAWING FIGURES

The above and/or other aspects of the present invention will become more apparent by describing in detail exemplary embodiments thereof with reference to the attached drawing figures, wherein.

DETAILED DESCRIPTION OF THE EXEMPLARY EMBODIMENTS

Figure 1:
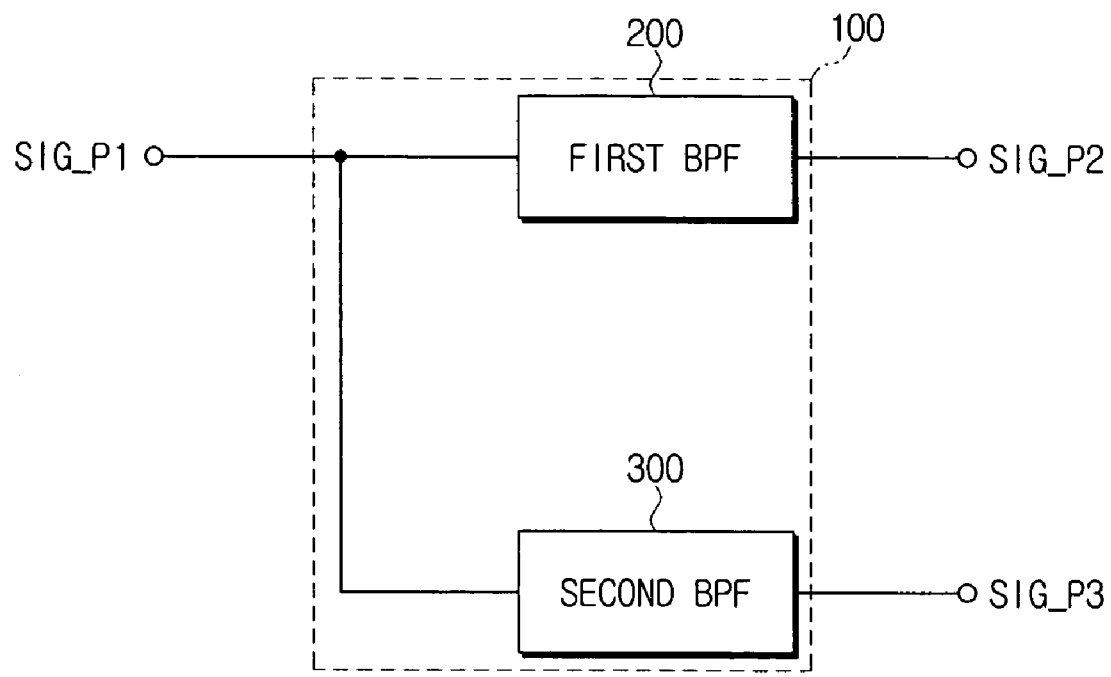
FIG. 1 is a simplified block diagram of a duplexer according to an exemplary embodiment of the present invention.

Hereinafter, exemplary embodiments of the present invention will be described in detail with reference to the accompanying drawing figures.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

FIG. 1 is a simplified block diagram of a duplexer according to an exemplary embodiment of the present invention.

Referring to FIG. 1, the duplexer 100 includes a first BPF 200 and a second BPF 300.

The first BPF 200 is interposed between a first signal port SIG_P1 and a second signal port SIG_P2 to filter signals in a first frequency band.

The second BPF 300 is interposed between the first signal port SIG_P1 and a third signal port SIG_P3 to filter signals in a second frequency band.

The first signal port SIG_P1, the second signal port SIG_P2, and the third signal port SIG_P3, outside the duplexer 100, can be an antenna port coupled to an antenna which transmits and receives a Tx signal and a Rx signal, a Tx port to which the Tx signal output from a communication device is applied, and a Rx port which forwards the Rx signal applied to the antenna port to the communication device, respectively.

The first BPF 200 and the second BPF 300 filter the Tx signal of the first frequency band and the Rx signal of the second frequency band, respectively, in which at least one FBAR is connected in series and in parallel.

The FBAR will now be illustrated in detail.

Figure 2:
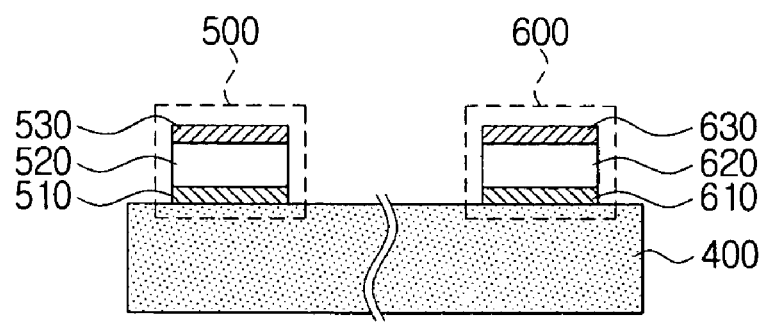
FIG. 2 is a cross-sectional view of an FBAR according to an exemplary embodiment of the present invention.

FIG. 2 is a cross-sectional view of an FBAR according to an exemplary embodiment of the present invention.

Referring to FIG. 2, the FBAR includes a Tx filter FBAR 500 and a Rx filter FBAR 600 both having a similar structure.

Specifically, the Tx filter FBAR 500 includes a lower electrode 510 made of a conductive material such as Al, W, Au, Pt or Mo on a substrate 400 of a semiconductive material such as SI or GaAs, a piezoelectric layer 520 made of a material such as AIN or ZnO and formed on the lower electrode 510, and an upper electrode 530 made of a conductive material such as Al, W, Au, Pt or Mo.

Similarly, the Rx filter FBAR 600 includes a lower electrode 610 made of a conductive material such as Al, W, Au, Pt or Mo on a substrate 400 of a semiconductive material such as SI or GaAs, a piezoelectric layer 620 made of a material such as AIN or ZnO and formed on the lower electrode 610, and an upper electrode 630 made of a conductive material such as Al, W, Au, Pt or Mo.

To prevent the bulk sound generated in the piezoelectric layers 520 and 620 from being affected by the substrate 400, the FBAR may further include a structure for isolating the substrate 400 from the Tx filter FBAR 500 and the Rx filter FBAR 600, e.g., a reflecting structure or an air gap structure.

The Tx filter FBAR 500 and the Rx filter FBAR 600 as induce an electric field in the piezoelectric layers 520 and 620 which temporally changes by applying voltage to the lower electrodes 510 and 610 and the upper electrodes 530 and 630, respectively. Accordingly, resonance occurs by generating the piezoelectric effect which outputs acoustic waves. The resonance frequencies of the Tx filter FBAR 500 and the Rx filter FBAR 600 are differently controlled by varying the surface area of the Tx filter FBAR 500 and the Rx filter FBAR 600 or the thickness of the upper electrodes 530 and 630.

Thus, the Tx filter FBAR 500 and the Rx filter FBAR 600 serve as a Tx filter and a Rx filter by controlling their respective resonant frequencies. The Tx filter and the Rx filter of the duplexer are formed, respectively, by connecting a plurality of the Tx filter FBARs 500 and the Rx filter FBARs 600 in series and in parallel, to thus enhance the tuning characteristic of the resonant frequency and the frequency filtering characteristic.

Referring back to FIG. 1, when the duplexer 100 in an exemplary embodiment of the present invention includes the first BPF 200 as the Tx filter and the second BPF 300 as the Rx filter, a phase shifter 70 (as explained in reference to FIG. 11) is used to prevent interference between the first BPF 200 and the second BPF 300.

To remove the phase shifter 70, in the duplexer 100 of an exemplary embodiment of the present invention, the second BPF 300 is in a line-open state for the first frequency band and the first BPF 200 is in a line-open state for the second frequency band. Accordingly, the first BPF 200 is formed to be electrically disconnected in the second frequency band, and the second BPF 300 is formed to be electrically disconnected in the first frequency band.

The first and second BPFs 200 and 300 will explained in more detail with reference to FIG. 3 through FIG. 8.

Figure 3:
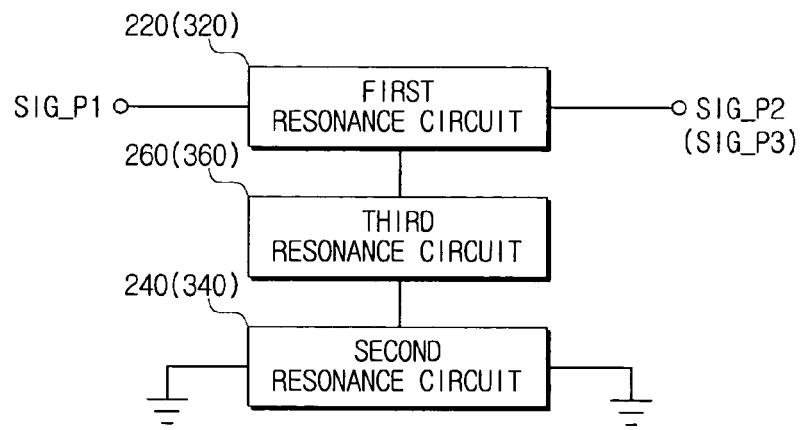
FIG. 3 is a simplified block diagram of first and second BPFs of FIG. 1.

FIG. 3 is a simplified block diagram of the first and second BPFs 200 and 300 of FIG. 1.

Referring to FIG. 3, according to an exemplary embodiment of the present invention, the first BPF 200 and the second BPF 300 include first resonance circuits 220 and 320, second resonance circuits 240 and 340, and third resonance circuits 260 and 360, respectively.

The first resonance circuit 220 of the first BPF 200 is coupled to the first signal port SIG_P1 and the second signal port SIG_P2, and the first resonance circuit 320 of the second BPF 300 is coupled to the first signal port SIG_P1 and the third signal port SIG_P3.

Accordingly, when the first signal port SIG_P1 functions as the antenna port, the second signal port SIG_P2 functions as the Tx port, and the third signal port SIG_P3 functions as the Rx port, the first BPF 200 is used as the Tx filter and the second BPF 300 is used as the Rx filter.

The second resonance circuits 240 and 340, respectively, of the first BPF 200 and the second BPF 300 face the first resonance circuits 220 and 320, and both ends of each of the second resonance circuits 240 and 340 are connected to ground GND.

The third resonance circuits 260 and the 360, respectively, of the first and second BPFs 200 and 300 are arranged on divided lines between the first resonance circuits 220 and 320 and the second resonance circuits 240 and 340, coupled in parallel to the first resonance circuits 220 and 320 and the second resonance circuits 240 and 340 so as to electrically coupled the first resonance circuits 220 and 320 with the second resonance circuits 240 and 340.

Each of the resonance circuits 220, 240, 260, and 320, 340, and 360 includes one or more resonators. The resonators may be film bulk acoustic resonators (FBARs).

In the first BPF 200, FBARs in the first resonance circuit 220 and FBARs in the second resonance circuit 240 form a ladder structure. The FBARs in the second resonance circuit 240 and FBARs in the third resonance circuit 260 form a ladder structure. As a result, the FBARs in the first, second, and third resonance circuits 220, 240, and 260 form a bridge structure of the first BPF 200.

The first BPF 200 will now be explained in further detail.

Figure 4:
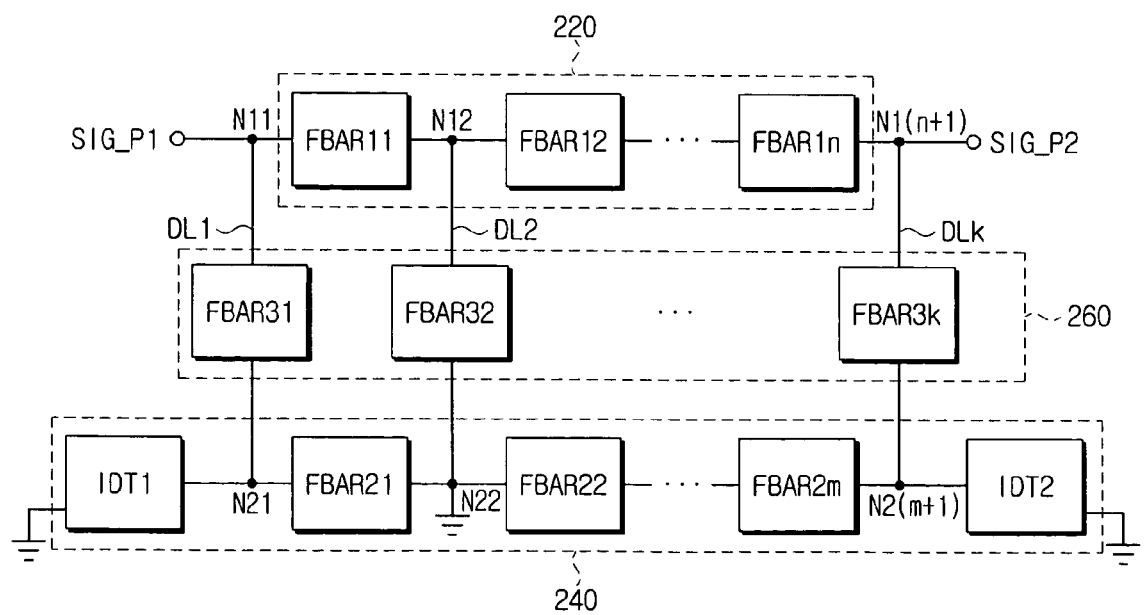
FIG. 4 is a block diagram of an exemplary first BPF of FIG. 1.
Figure 5:
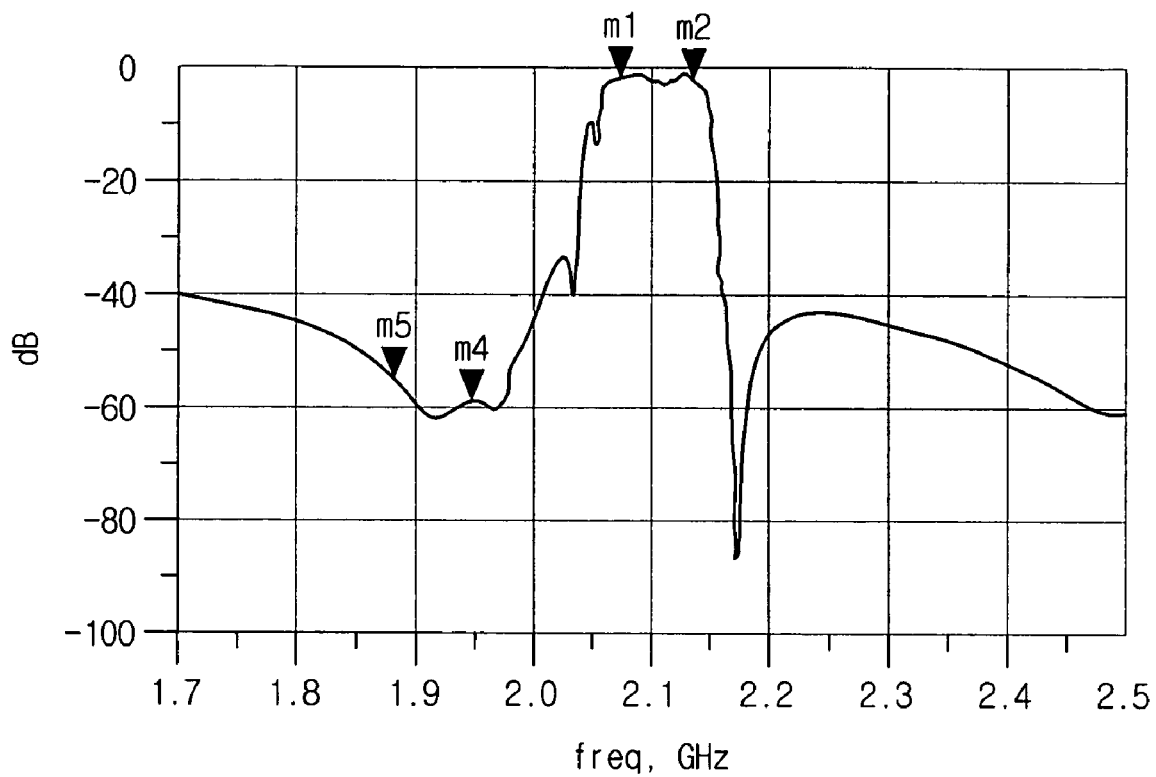
FIG. 5 is a graph showing a simulation result of filtering characteristic of the first BPF of FIG. 4.
Figure 6:
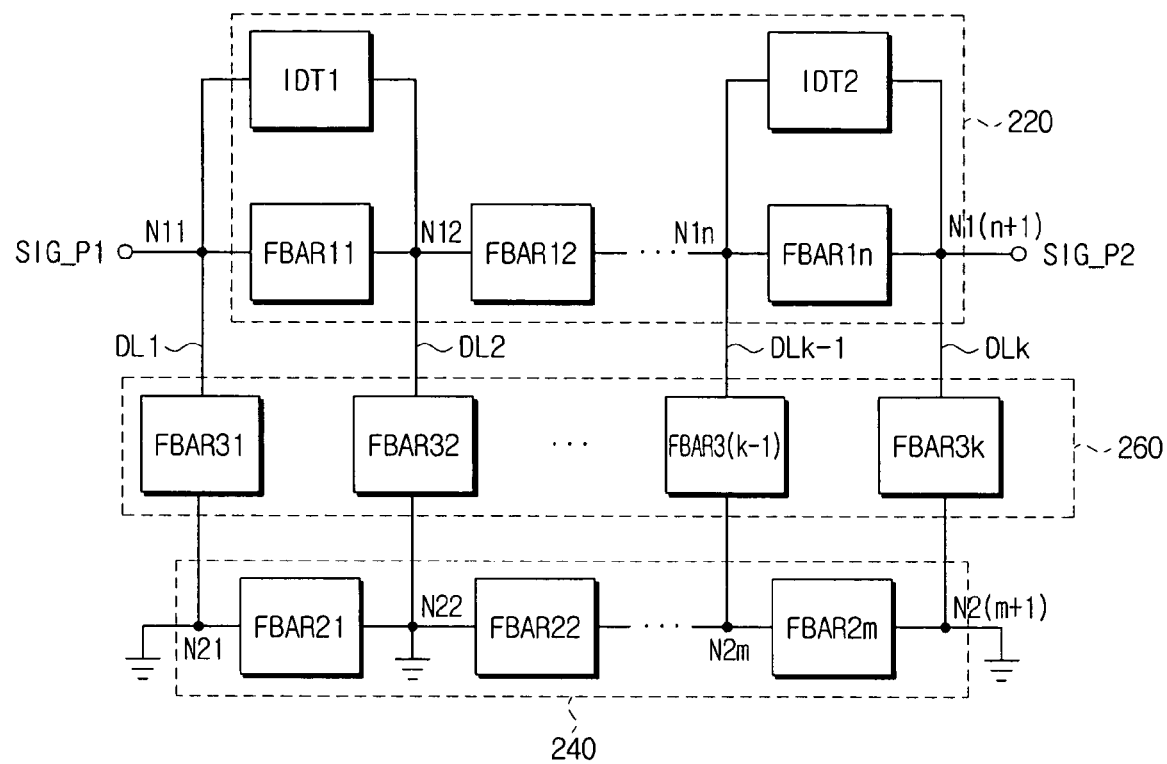
FIG. 6 is a block diagram of another exemplary embodiment of the first BPF of FIG. 1.

FIG. 4 is a block diagram of an exemplary embodiment of the first BPF 200 of FIG. 1; FIG. 5 is a graph showing a simulation result of filtering characteristic of the first BPF 200 of FIG. 4; and FIG. 6 is a block diagram of another exemplary embodiment of the first BPF 200 of FIG. 1.

Referring first to FIG. 4, the first BPF 200 comprises a first resonance circuit 220 between a first signal port SIG_1 and a second signal port SIG_P2, a second resonance circuit 240 facing the first resonance circuit 220, and a third resonance circuit 260 on divided lines DL1, DL2 through DLk which electrically couple the first and second resonance circuits 220 and 240. The third resonance circuit 260 is coupled in parallel to the first and second resonance circuits 220 and 240.

The first resonance circuit 220 comprises a plurality of resonators FBAR1 through FBAR1n coupled together in series between the first signal port SIG_P1 and the second signal port SIG_P2.

The second resonance circuit 240 comprises a plurality of resonators FBAR21 through FBAR2m coupled together in series. Both ends of the second resonance circuit 240 are coupled to ground GND. A first inductor IDT1 is formed at a node N21 between ground GND and the resonator FBAR21, and a second inductor IDT2 is formed at a node 2(m+1) between ground GND and the resonator FBAR2m.

The first and second inductors IDT1 and IDT2 are provided to prevent a change of the resonant frequency characteristic intended at the design phase since the Tx frequency and the Rx frequency are applied to the duplexer 100 in different frequency bands.

It is advantageous to couple only one of the nodes N22 through N2m formed between the resonators FBAR21 through FBAR2m to ground, e.g., to couple only the node N22 to ground GND so as to stabilize the received or transmitted frequency.

The third resonance circuit 260 comprises a plurality of resonators FBAR31 through FBAR3k each comprising at least one FBAR. The resonators FBAR31 through FBAR3k are formed on the divided lines DL1 through DLk in parallel to the first resonance circuit 220 and the second resonance circuit 240, and couple the first and second resonance circuits 220 and 240 together.

For instance, the resonator FBAR31 is formed on the first divided line DL1 which is bifurcated at a node N11 between the first signal port SIG_P1 and the resonator FBAR11 and coupled to the node N21 between ground GND and the resonator FBAR21.

Accordingly, the resonators in the first, second, and third resonance circuits 220, 240, and 260 form a bridge structure. For instance, the resonator FBAR11 of the first resonance circuit 220, the resonator FBAR21 of the second resonance circuit 240, and the resonator FBAR31 and the resonator FBAR32 of the third resonance circuit 260 form the bridge structure.

With the first BPF 200 constructed as above, abrupt attenuation shows outside the frequency band to be filtered by the BPF, e.g., the frequency band of about 2.07~about 2.16 GHz, and a transmission coefficient is high in the frequency band of about 2.07~about 2.16 GHz as shown in FIG. 5. Hence, as shown in FIG. 5, the filtering characteristic efficiently passes this frequency band.

By contrast, in the adjacent frequency band, i.e., in the frequency band of about 1.88~about 1.95 GHz, the transmission coefficient is below about −40 dB. As such, FIG. 5 shows a filtering characteristic that lowers the transmission characteristic in the frequency band adjacent to the pass frequency band. Thus, the structure of the BPF is suitable for applications where the difference between the Tx frequency band the Rx frequency band is small, for example, in the mobile communication device.

Although FIG. 4 illustrates the number of the resonators FBAR1 through FBAR1n in the first resonance circuit 220 equal to the number of the resonators FBAR21 through FBAR2m in the second resonance circuit 240, that is, n is equal to m, the number of the resonators may differ.

In FIG. 4, k=n+1 since the bridge structure is established by the resonator FBAR31 formed on the divided line DL1 coupling the node N11 and the node N21 by way of example. Note that k may be n−1 by eliminating the divided lines DL1 and DLk at the node N11 and the node N1(n+1).

In addition, the resonators in the first, second, and third resonance circuits 220, 240, and 260 can form a bridge structure by varying the number of the divided lines DLs.

In FIG. 4, the first resonators FBAR11 through FBAR1n may have a different resonant frequency from the second resonators FBAR21 through FBAR2m. The first resonators FBAR11 through FBAR1n and the second resonators FBAR21 through FBAR2m may have different resonant frequencies from one another, respectively. That is, the resonant frequencies of the resonators may be arbitrarily set during the design phase so as to form the resonant frequency of the frequency band to be filtered.

Referring now to FIG. 6, a BPF 200 according to another exemplary embodiment of the present invention comprises a first resonance circuit 220 coupled to a first signal port SIG_P1 and a second signal port SIG_P2, a second resonance circuit 240 facing the first resonance circuit 220, and a third resonance circuit 260 formed on divided lines DL1 through DLk that electrically couple the first resonance circuit 220 and the second resonance circuit 240.

In the first resonance circuit 220, a plurality of resonators FBAR1 through FBAR1n comprising at least one FBAR are coupled together serially between the first signal port SIG_P1 and the second signal port SIG_P2. Inductors IDT1 and IDT2 are coupled in parallel to the resonators at the front end and the back end of the first resonance circuit 220, that is, in parallel to the resonator FBAR11 and the resonator FBAR1n, respectively. The first and second inductors IDT1 and IDT2 are provided to prevent a change of the intended resonant frequency characteristic since signals of different frequency bands are applied to the duplexer 100.

In the second resonance circuit 240, a plurality of resonators FBAR21 through FBAR2m comprising at least one FBAR are coupled together in series. Both ends of the second resonance circuit 240 are coupled to ground GND. It is advantageous to couple one of the nodes formed between the resonators FBAR22 through FBAR2m to the ground GND to stabilize the Tx and Rx frequencies.

In the third resonance circuit 260, a plurality of resonators FBAR31 through FBAR3m comprising at least one FBAR are arranged in parallel along the divided lines DL1 through DLk and couple the first resonance circuit 220 and the second resonance circuit 240 together. For instance, the resonator FBAR31 is arranged on the first divided line DL1 that is bifurcated at a node N11 between the first signal port SIG_P1 and the resonator FBAR11 and coupled to the node N21 between ground GND and the resonator FBAR21.

Accordingly, the resonators FBARs in the first, second, and third resonance circuits 220, 240, and 260 form a bridge structure. By way of example, the resonator FBAR11 of the first resonance circuit 220, the resonator FBAR21 of the second resonance circuit 240, and the resonators FBAR31 and FBAR32 of the third resonance circuit 260 form the bridge structure.

The first BPF 200 configured as above thus has the filtering characteristics similar to those as shown in FIG. 5. Particularly, the transmission coefficient is almost constant in the frequency band adjacent to the pass frequency band of the first BPF 200, e.g., in the frequency band of about 1.88~about 1.95 GHz. Hence, the first BPF 200 can obtain the more stabilized filtering characteristics.

Referring back to FIGS. 1 and 3, in the second BPF 300 according to an exemplary embodiment of the present invention, the FBARs in the first resonance circuit 320 and the FBARs in the second resonance circuit 340 form the ladder structure, and the FBARs in the second resonance circuit 340 and the FBARs in the third resonance circuit 360 form the ladder structure as well. As a result, the FBARs in the first, second, and the third resonance circuits 320, 340, and 360 form a bridge structure of the second BPF 300.

Figure 7:
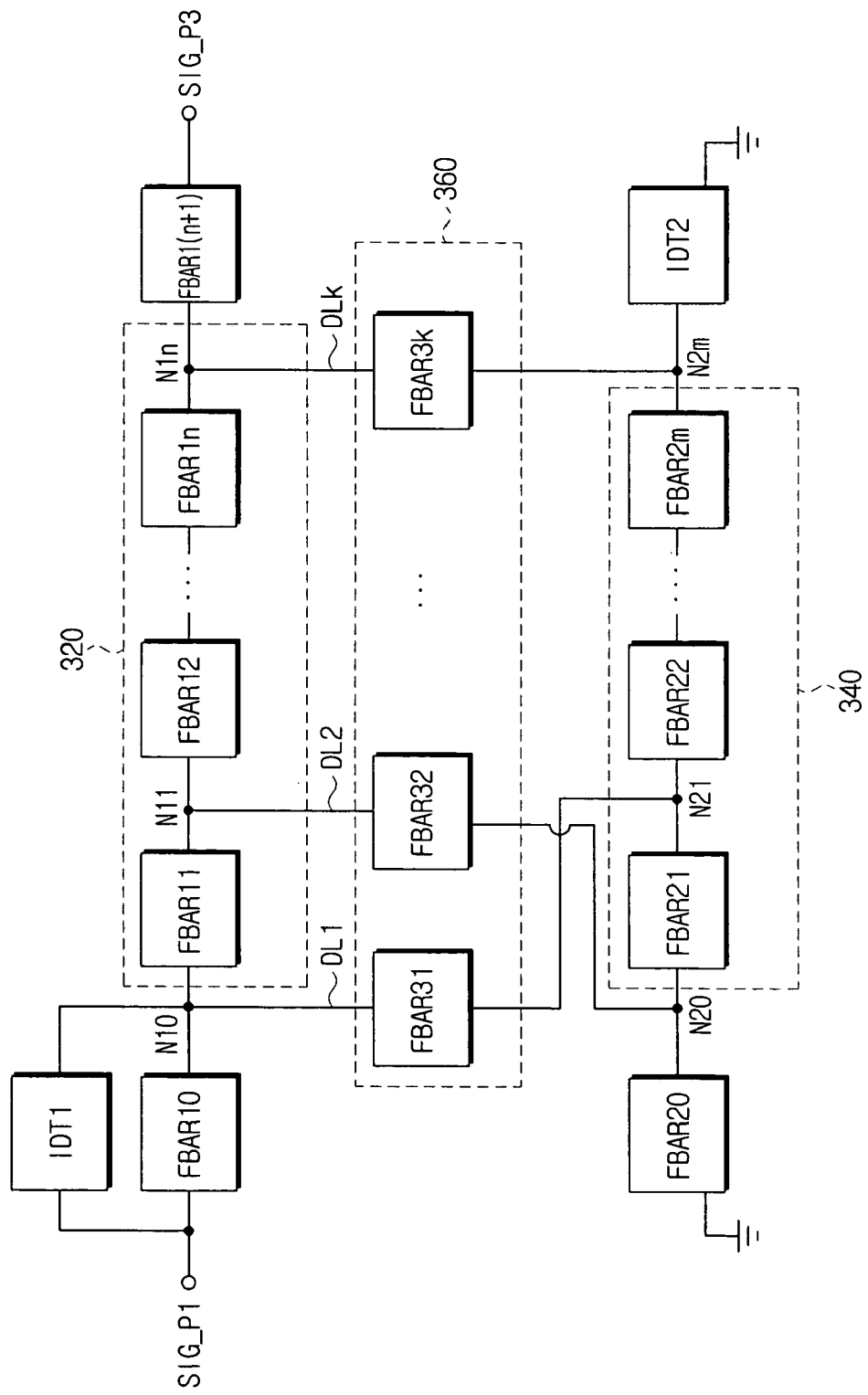
FIG. 7 is a block diagram of an exemplary embodiment of the second BPF of FIG. 1.

At least one pair of the divided lines coupling the first resonance circuit 320 and the second resonance circuit 340 is formed to cross each other, and the FBAR of the third resonance circuit 360 is formed in the crossing line, as shown in FIG. 7 with reference to the description of the second BPF 300.

Further detailed descriptions will now be provided on the second BPF 300.

Figure 8:
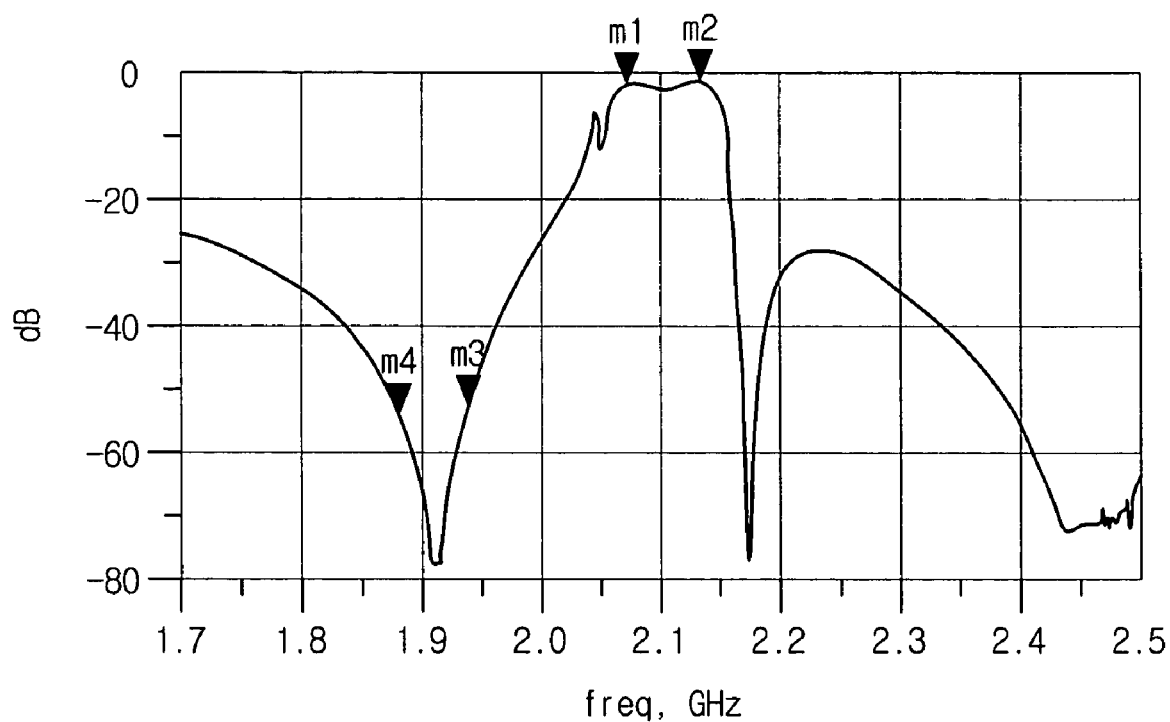
FIG. 8 is a graph showing a simulation result of filtering characteristic of the second BPF of FIG. 7.

FIG. 7 is a block diagram of an exemplary embodiment of the second BPF 300 of FIG. 1, and FIG. 8 is a graph showing a simulation result of a filtering characteristic of the second BPF 300 of FIG. 7.

Referring to FIG. 7, the second BPF 300 comprises a first resonance circuit 320 coupled to a first signal port SIG_P1 and a third signal port SIG_P3, a second resonance circuit 340 facing the first resonance circuit 320, and a third resonance circuit 360. The third resonance circuit 360 is formed along divided lines DL1 through DLk electrically coupling the first resonance circuit 320 and the second resonance circuit 340, and coupled in parallel to the first and second resonators 320 and 340 to electrically couple them.

Specifically, the first resonance circuit 320 comprises a plurality of resonators FBAR1 through FBAR1n comprising at least one FBAR coupled together in series between the first signal port SIG_P1 and the third signal port SIG_P3.

The second BPF 300 further comprises a resonator FBAR10 coupled between the first resonance circuit 320 at node N10 and the first signal port SIG_P1, and a resonator FBAR1(n+1) coupled between the first resonator 320 at node N1n and the second signal port SIG_P2. The resonator FBAR10 and the resonator FBAR1(n+1) are coupled in series to the first resonance circuit and enhance the attenuation characteristic in the frequency band adjacent to the pass frequency band of the second BPF 300. The resonator FBAR10 and the resonator FBAR1(n+1) thus represent fourth resonators in the second BPF 300.

An inductor IDT1 for impedance matching is coupled in parallel to the resonator FBAR10 between the first resonance circuit 320 and the first signal port SIG$_{13}$ P1.

The second resonance circuit 340 includes a plurality of resonators FBAR21 through FBAR2m comprising at least one FBAR in series. Both ends of the second resonance circuit 340 are coupled to ground GND. The second BPF 300 further comprises a resonator FBAR20, serially coupled to the second resonance circuit 340, at a node N20 between ground GND and the second resonance circuit 340 and enhances the attenuation characteristic in the frequency band adjacent to the pass frequency band of the second BPF 300. A second inductor IDT2 is provided at a node N2m, between ground GND and the resonator FBAR2m. The resonator FBAR20 thus denotes a fifth resonator of the BPF.

A second inductor IDT2 is provided to prevent a change of the resonant frequency characteristic intended at the design phase since the Tx and Rx frequencies operate in the duplexer 100 in different frequency bands.

The third resonance circuit 360 comprises a plurality of resonators FBAR31 through FBAR3k. The resonators FBAR31 through FBAR3k are coupled in parallel along the divided lines DL1 through DLk coupling together the first resonance circuit 320 and the second resonance circuit 340.

For example, the resonator FBAR3k is arranged in the k-th divided line DLk which is bifurcated from the node N1 of the first resonance circuit 320 and coupled to the node N2m of the second resonance circuit 340.

At least one pair of the divided lines DL1 through DLk, e.g., the first divided line DL1 and the second divided line DL2 are crossed with each other. More specifically, the first divided line DL1 and the second divided line DL2 are bifurcated from both ends of the first resonator and the second resonator facing each other, e.g., the resonator FBAR11 and the resonator FBAR21. The first divided line DL1 couples the front-end node N10 of the resonator FBAR11 with the back-end node N21 of the resonator FBAR21. The second divided line DL2 couples the back-end node N11 of the resonator FBAR11 with the front-end node N20 of the resonator FBAR21.

Accordingly, the resonators in the first, second, and third resonance circuits 320, 340, and 360 form a bridge structure where at least one pair of the divided lines crosses each other.

The second BPF 200 constructed as above shows an abrupt attenuation characteristic outside the frequency band to be filtered by the second BPF 300, e.g., outside of about 2.07 GHz~about 2.16 GHz frequency band, and a good filtering characteristic in about a 2.07 GHz~about 2.16 GHz frequency band with the great transmission coefficient, as shown in FIG. 8.

By contrast, since a transmission coefficient is below about −40 dB in the adjacent frequency band, e.g., in a frequency band of about 1.88 GHz~about 1.95 GHz, the filtering characteristic lowers the transmission coefficient in the frequency band adjacent to the pass frequency band. Hence, the second BPF 300 has the structure suitable for applications when the difference of the Tx and Rx frequency bands is small in the mobile communication device.

Although the simulation is conducted by setting the pass frequency band of the second BPF 300 to the frequency band of the Tx signal, the second BPF 300 may filter the Rx signal of a frequency band of about 1.88 GHz~about 1.95 GHz by controlling the resonant frequencies of the FBARs in the first, second, and third resonance circuits 320, 340, and 360 of the second BPF 300.

In an exemplary embodiment of the present invention, it has been described that the first BPF 200 and the second BPF 300 each have different structures. However, the first BPF 200 and the second BPF 300 may also have the same structure. Alternatively, the first BPF 200 and the second BPF 300 can constitute the duplexer 100 in combination with other examples.

Figure 9:
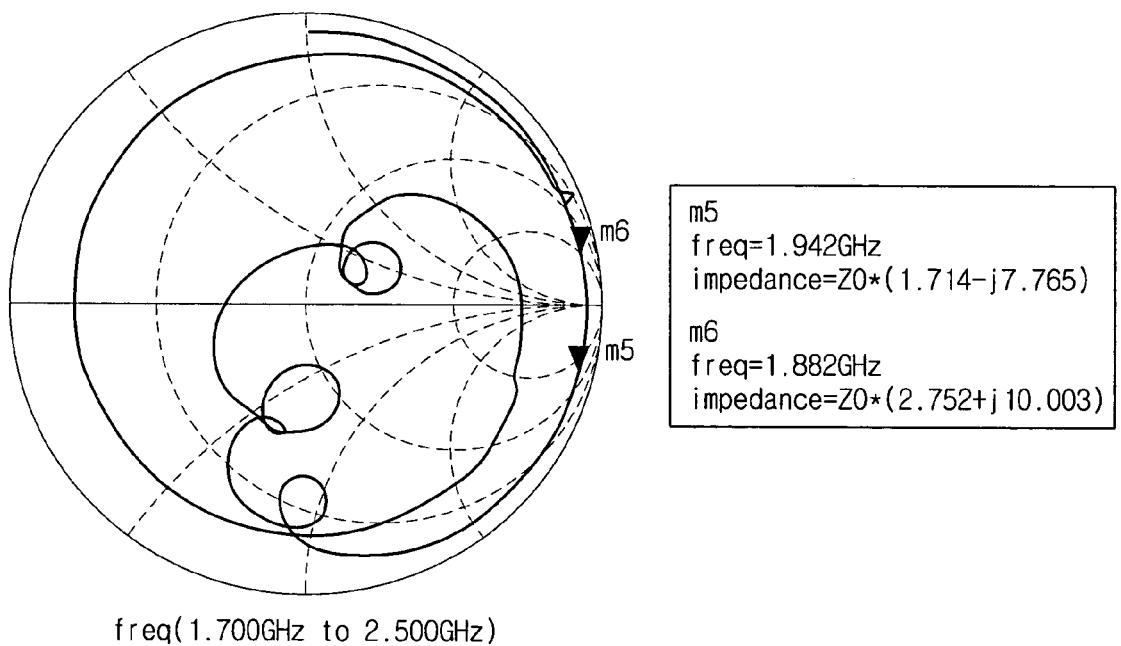
FIG. 9 is a diagram showing impedance characteristic of the second BPF to the first BPF of FIG. 1.

FIG. 9 is a diagram comparing a impedance characteristic of the second BPF 300 to an impedance characteristic of the first BPF 200 of FIG. 1.

In reference to FIG. 1 through FIG. 9, with the first and second BPFs 200 and 300 constructed as described above, when the Rx signal has a specific frequency range, e.g., about 1.88 GHz~about 1.95 GHz frequency band as shown in FIG.

9, the impedance of the second BPF 300 to the first BPF 200 is close to infinity. Thus, the first PBF 200 is in a line-open state with respect to the second BPF 300. As a result, the first BPF 200 is electrically disconnected from the second BPF 300 to prevent the first BPF 200 from being coupled and operated by the Rx signal.

Figure 11:
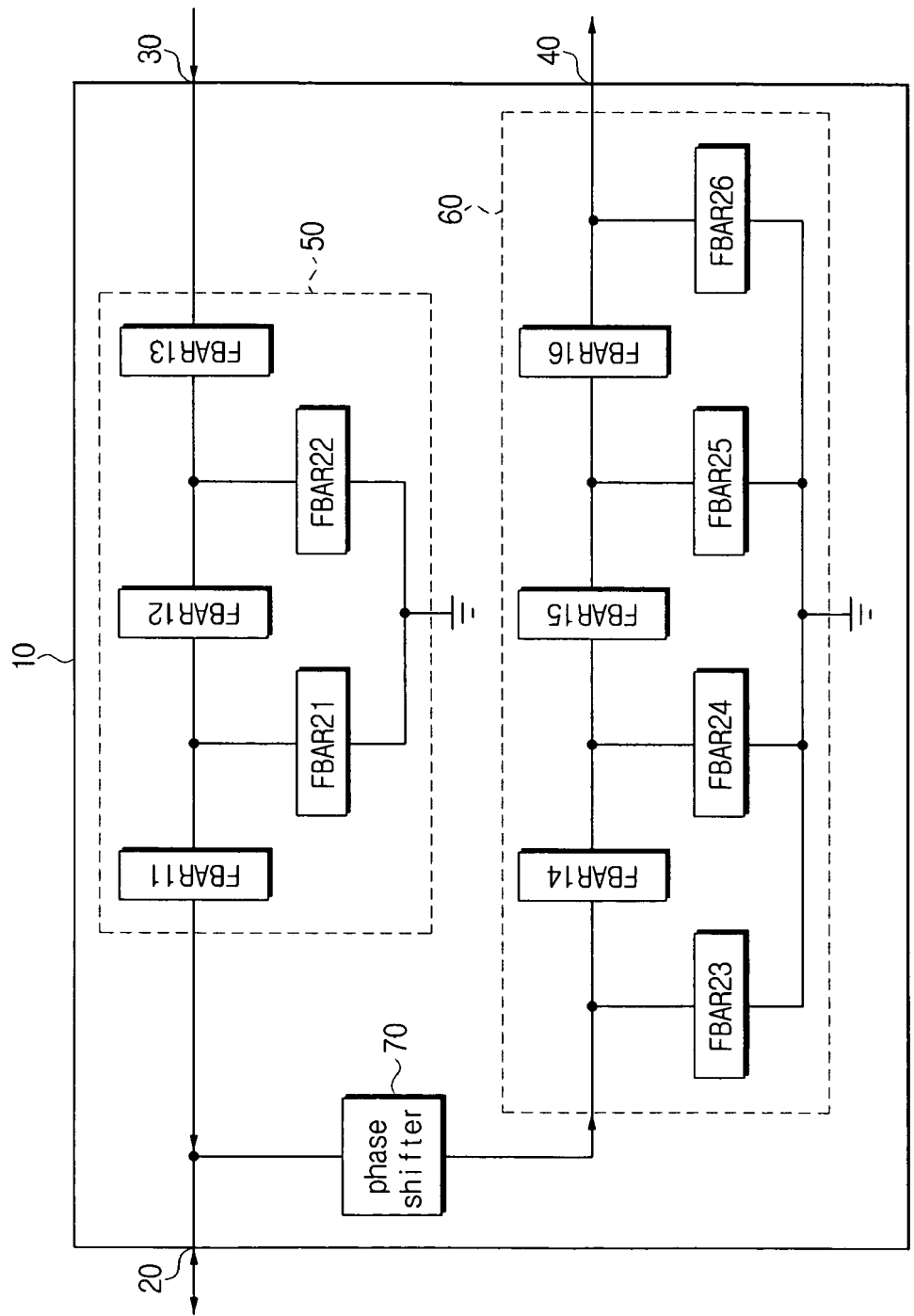
FIG. 11 is a block diagram of a related art duplexer constructed using a plurality of FBARs.
Figure 12:
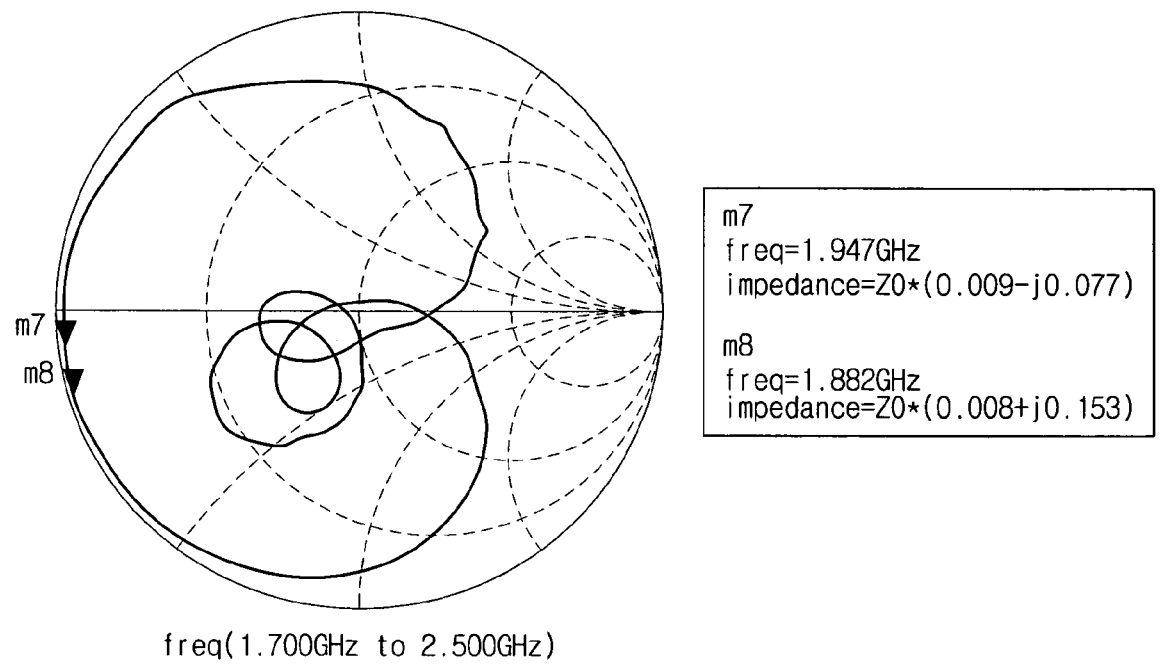
FIG. 12 is a diagram showing a function of the phase shifter of FIG. 11.
Figure 13:
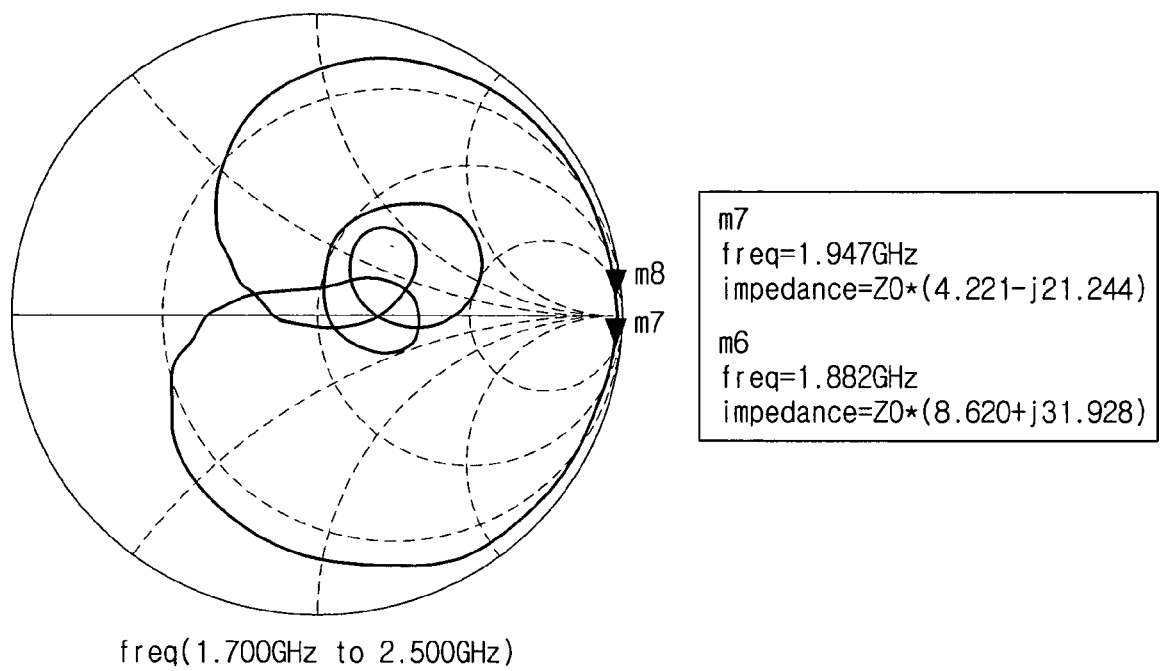
FIG. 13 is another diagram showing a function of the phase shifter of FIG. 11.

This implies the first and second BPFs 200 and 300, per se, can avoid the interference by the Tx signal and the Rx signal respectively applied to the first BPF 200 and the second BPF 300, without the phase shifter 700 of FIG. 11.

It has been exemplified that the first BPF 200 is in a line-open state for the Rx signal. Yet, when the Tx signal has a specific frequency range, e.g., about 2.07 GHz~about 2.16 GHz frequency band in the same principle by way of example, the impedance of the first BPF 200 to the second BPF 300 is close to infinity and the second BPF 300 is in a line-open state. Therefore, the second BPF 300 is electrically disconnected from the first BPF 200 so as to prevent the second BPF 300 from being coupled and operated by the Tx signal.

Figure 10:
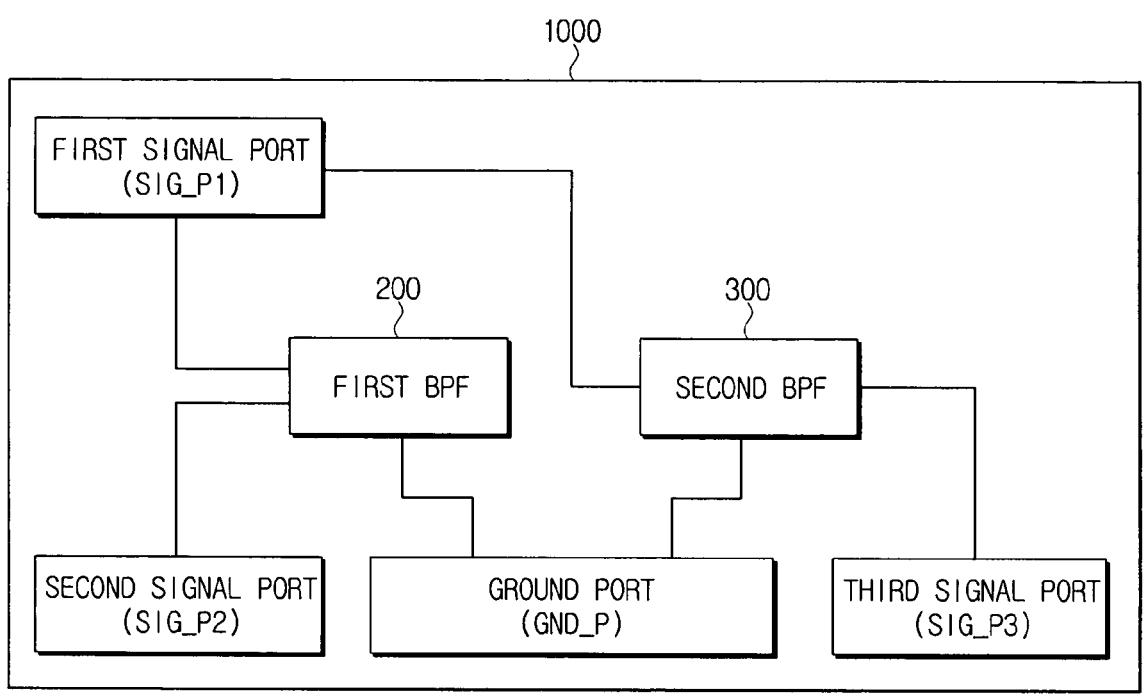
FIG. 10 is a block diagram of a duplexer constructed as a single chip set according to an exemplary embodiment of the present invention.

FIG. 10 is a block diagram of a duplexer as a single chip set according to an exemplary embodiment of the present invention.

As shown in FIG. 10, the duplexer 1000 comprises a first BPF 200, a second BPF 300, a first signal port SIG_P1, a second signal port SIG_P2, a third signal port SIG_P3, and a ground port GND_P.

The first and second BPFs 200 and 300 can employ a filter implemented by incorporating FBARs in series and in parallel according to an exemplary embodiment of the present invention.

The first, second, and third signal ports SIG_P1, SIG_P2, and SIG_P3, which can electrically couple with external elements, are formed using a conductive material. The first, second, and third signal ports SIG_P1, SIG_P2, and SIG_P3 are coupled to the first and second BPFs 200 and 300 through connection lines comprising a metal material.

The ground port GND_P is a part electrically coupled to an external ground terminal. The ground port GND_P coupled to the BPFs 200 and 300 through connection lines comprising a metal material.

The first signal port SIG_P1 couples an external antenna (not shown) to the first and second BPFs 200 and 300. When the first BPF 200 is the Tx filter and the second BPF 300 is the Rx filter, the Tx signal is applied to the Tx filter and then output to the antenna and the Rx signal is applied to the Rx filter from the antenna while the interference between the Tx and Rx signals are prevented by virtue of the structures of the first and second BPFs 200 and 300 according to an exemplary embodiment of the present invention.

Accordingly, it is possible to remove the phase shifter 70 incorporating the inductors and the capacitors as shown in FIG. 11, and the process margin of the FBARs can be improved. This enhances the resonant frequency characteristic by expanding the surface area of the FBARs.

In light of the foregoing, the process margin can be improved in the assembly of the duplexer as a single ship by removing the phase shifter which is the crucial component of the related art duplexer which receives or outputs the Tx and Rx signals via one antenna.

With the improved process margin of the duplexer, the surface area of the FBARs can be expanded to thus enhance the performance of the duplexer.

Furthermore, the assembly cost of the duplexer can be reduced by eliminating processes and circuit elements for the fabrication of the phase shifter.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A duplexer comprising:
   a first band pass filter (BPF) coupled to a first signal port and a second signal port; and
   a second BPF coupled to the first signal port and a third signal port,
   each of the first BPF and the second BPF comprising:
      a first resonance circuit which comprises a plurality of first resonators coupled in series;
      a second resonance circuit which comprises a plurality of second resonators coupled in series; and
      a third resonance circuit which comprises a plurality of third resonators coupled in parallel and formed in divided lines coupling the first and second resonance circuits,
   wherein, in the second resonance circuit of the first BPF, only one node of a plurality of nodes between the second resonators is connected to ground.

2. The duplexer as in claim 1, wherein the first, second, and third Resonators are film bulk acoustic resonators (FBARs).

3. The duplexer as in claim 1, wherein the first and second BPFs filter Signals of first and second frequency bands, respectively, the second BPF is in a line-open state in the first frequency band, and the first BPF is in a line-open state in the second frequency band.

4. The duplexer as in claim 1, wherein the first resonance circuit of the first BPF is coupled between the first signal port and the second signal port, and the first resonance circuit of the second BPF is coupled between the first signal port and the third signal port.

5. The duplexer as in claim 1, wherein both ends of the second resonance circuit of each of the first and second BPFs are coupled to ground.

6. The duplexer as in claim 5, wherein the first BPF further comprises inductors coupled to the second resonance circuit and ground.

7. The duplexer as in claim 5, wherein the first BPF further comprises an inductor coupled in parallel to a front-end first resonator and an inductor coupled in parallel to a back-end first resonator of the plurality of first resonators of the first resonance circuit.

8. The duplexer as in claim 5, wherein the first and second resonators of the first BPF are arranged to face each other, and the divided lines couple together the facing first and second resonators.

9. A duplexer comprising:
   a first band pass filter (BPF) coupled to a first signal port and a second signal port; and
   a second BPF coupled to the first signal port and a third signal port,
   each of the first BPF and the second BPF comprising:
      a first resonance circuit which comprises a plurality of first resonators coupled in series;
      a second resonance circuit which comprises a plurality of second resonators coupled in series; and
      a third resonance circuit which comprises a plurality of third resonators coupled in parallel and formed in divided lines coupling the first and second resonance circuits,
   wherein the first and second resonators of the second BPF are arranged to face each other, a first divided line couples a front-end node of the first resonator of the second BPF with a back-end node of the second resonator of the second BPF, and a second divided line couples a back-end node of the first resonator of the second BPF with a front-end node of the second resonator of the second BPF.

10. The duplexer as in claim 1, wherein the second BPF further comprises a plurality of fourth resonators coupled between the first signal port and the first resonance circuit and between the second signal port and the first resonance circuit, respectively.

11. The duplexer as in claim 10, wherein the second BPF further comprises an inductor which is coupled in parallel to the fourth resonator coupled between the first signal port and the first resonance circuit.

12. The duplexer as in claim 1, wherein the second BPF further comprises an inductor coupled between the back end node of the second resonance circuit and ground.

13. A duplexer comprising:
  a first band pass filter (BPF) which is coupled to a first signal port and a second signal port; and
  a second BPF which is coupled to the first signal port and a third signal port,
  wherein a frequency band of a signal passed by the first BPF is suppressed by the second BPF without using a phase shifter,
  wherein each of the first BPF and the second BPF comprises:
    a first resonance circuit which comprises a plurality of first resonators coupled in series;
    a second resonance circuit which comprises a plurality of second resonators coupled in series; and
    a third resonance circuit which comprises a plurality of third resonators coupled in parallel and formed in divided lines coupling the first and second resonance circuits, and
  wherein, in the second resonance circuit of the first BPF, a node of a plurality of nodes between the second resonators is connected to ground.

14. The duplexer as in claim 13, wherein a frequency band of a second signal passed by the second BPF is suppressed by the first BPF without using a phase shifter.

15. The duplexer as in claim 13, wherein the second BPF suppresses the signal by about 40 dB.

16. The duplexer as in claim 14, wherein the second BPF suppresses the signal by about 40 dB, and the first BPF suppresses the second signal by about 40 dB.

17. The duplexer as in claim 13, wherein the first, second, and third resonators are film bulk acoustic resonators (FBARs).

* * * * *